United States Patent [19]
Kim

[11] Patent Number: 6,157,017
[45] Date of Patent: Dec. 5, 2000

[54] SOLID-STATE IMAGING DEVICES HAVING COMBINED MICROLENS AND LIGHT DISPERSION LAYERS FOR IMPROVED LIGHT GATHERING CAPABILITY AND METHODS OF FORMING SAME

[75] Inventor: Sang-Sik Kim, Kyunggi-do, Rep. of Korea

[73] Assignee: Samsung Electronics Co., Ltd., Rep. of Korea

[21] Appl. No.: 09/083,261

[22] Filed: May 21, 1998

[30] Foreign Application Priority Data

Mar. 5, 1998 [KR] Rep. of Korea ......................... 98-7218

[51] Int. Cl.[7] .................................................. H01L 27/14
[52] U.S. Cl. ........................................ 250/208.1; 250/216
[58] Field of Search ................................ 250/208.1, 216, 250/208.2, 208.3, 208.4, 208.5, 208.6, 214.1, 214 R; 257/431, 432, 433, 434, 435

[56] References Cited

U.S. PATENT DOCUMENTS

| | | | |
|---|---|---|---|
| 4,689,291 | 8/1987 | Popovic et al. | 430/321 |
| 5,081,545 | 1/1992 | Sugawara et al. | 359/625 |
| 5,085,977 | 2/1992 | Sugawara et al. | 430/321 |
| 5,166,755 | 11/1992 | Gat | 356/419 |
| 5,250,798 | 10/1993 | Iizuka et al. | 250/208.1 |
| 5,371,397 | 12/1994 | Maegawa et al. | 257/432 |
| 5,420,634 | 5/1995 | Matsumoto | 348/311 |
| 5,439,621 | 8/1995 | Hoopman | 264/2.5 |
| 5,453,876 | 9/1995 | Hamada | 359/625 |
| 5,466,926 | 11/1995 | Sasano et al. | 250/216 |
| 5,543,830 | 8/1996 | Lea | 347/241 |
| 5,543,942 | 8/1996 | Mizuguchi et al. | 359/40 |
| 5,550,656 | 8/1996 | Sprague et al. | 359/40 |
| 5,581,379 | 12/1996 | Aoyama et al. | 349/5 |
| 5,650,876 | 7/1997 | Davies et al. | 359/622 |
| 5,672,519 | 9/1997 | Song et al. | 437/3 |
| 5,717,453 | 2/1998 | Wohlstadter | 348/46 |
| 5,737,098 | 4/1998 | Sayag | 358/483 |

FOREIGN PATENT DOCUMENTS

| | | |
|---|---|---|
| 4-303801 | 10/1992 | Japan . |
| 6-053458 | 2/1994 | Japan . |
| 6-112459 | 4/1994 | Japan . |
| 7-074331 | 3/1995 | Japan . |
| 10-022487 | 1/1998 | Japan . |

OTHER PUBLICATIONS

Microlensarrays, 5 pages, web page, University of Neuchâtel, Switzerland, at http://www–optics.unine.ch.

*Primary Examiner*—John R. Lee
*Attorney, Agent, or Firm*—Myers Bigel Sibley & Sajovec

[57] ABSTRACT

Solid-state imaging devices having combined microlens and light dispersion layers include a semiconductor substrate, a light transmission layer and an improved lens layer. The semiconductor substrate and light transmission layer collectively form an imaging substrate having a face thereon and a plurality of light sensing elements therein extending adjacent the face. The light transmission layer may include a first polarizing layer, an array of color filters and a second polarizing layer. The lens layer comprises an array of microlenses and a light dispersion layer. The preferred lens layer is formed on an upper face of the imaging substrate. The array of microlenses in the lens layer may be formed by reflowing a two-dimensional array of spaced photoresist regions (e.g., resist cylinders) as circular-shaped lenses having convex outer surfaces. A light dispersion layer is also preferably formed on the face of the imaging substrate. The light dispersion layer may be formed as a conformally deposited mesh-shaped layer having openings therein which are defined by the array of microlenses and having concave-shaped depressions therein which extend between adjacent microlenses. The light dispersion layer is preferably formed of a material having an index of refraction in a range between about 1.45 and 1.50 and the microlenses are preferably formed of a material having an index of refraction in a range between about 1.65 and 1.70.

12 Claims, 3 Drawing Sheets

SOLID-STATE IMAGING DEVICES HAVING COMBINED MICROLENS AND LIGHT DISPERSION LAYERS FOR IMPROVED LIGHT GATHERING CAPABILITY AND METHODS OF FORMING SAME

FIELD OF THE INVENTION

The present invention relates to solid-state imaging devices and methods of forming same and more particularly, to solid-state imaging devices which utilize microlens structures and methods of forming same.

BACKGROUND OF THE INVENTION

Solid-state color imaging devices typically utilize arrays of microlenses to direct light received at a face thereof to internal light sensing elements. For example, as illustrated by FIG. 1, a conventional solid-state imaging device may include a semiconductor substrate 2 and an array of charge coupled devices (CCDs) formed as an array in the substrate 2. The CCD array may include a plurality of light sensing elements 4 (e.g., photodiodes) spaced by a plurality of channel regions 5 which extend opposite respective insulated gate electrodes 10. These gate electrodes 10 may include first and second polysilicon layers 8a and 8b and an insulating region 6, as illustrated. A pad layer 13 may also be provided. A first polarizing layer 12 may be formed on the substrate 2. An array of color filters 14 (e.g., red (R), green (G) and blue (B)) and a second polarizing layer 16 may also be formed on the first polarizing layer 12. As illustrated, the color filters 14 may be defined to extend opposite respective light sensing elements 4. In addition, to focus incident light 20 towards the light sensing elements 4, an array of microlenses 18 are provided on the second polarizing layer 16, as illustrated. Unfortunately, light 20 incident portions of the second polarizing layer 16 which are exposed by gaps in the spacing between adjacent microlenses 18 may be reflected backwards towards the source of light 20 and, therefore, not collected by the light sensing elements 4. Accordingly, notwithstanding such solid-state imaging devices which utilize microlens arrays, there continues to be a need for improved solid-state imaging devices which have increased light gathering capability.

SUMMARY OF THE INVENTION

It is therefore an object of the present invention to provide improved solid-state imaging devices and methods of making same.

It is another object of the present invention to provide solid-state imaging devices having improved light gathering capability and methods of making same.

These and other objects, features and advantages of the present invention are provided by solid-state imaging devices which include a semiconductor substrate, a light transmission layer and a lens layer. The semiconductor substrate and light transmission layer collectively form an imaging substrate having a face thereon and a plurality of light sensing elements therein extending adjacent the face. The lens layer comprises an array of microlenses and a light dispersion layer. The light sensing elements may be formed as an array of photosensitive charge-coupled devices (CCD) having a plurality of gate electrodes, channel regions and light receiving elements (e.g., photodiodes) which generate charge carriers in the semiconductor substrate in response to incident light which passes through the light transmission layer. The light transmission layer may include a first polarizing layer, an array of color filters and a second polarizing layer. The thickness of the light transmission layer may also be chosen to improve the efficiency of charge carrier generation in the light receiving elements by appropriately matching the focal length of the microlenses to the distance between the microlenses and the light receiving elements. The array of color filters may comprise a rectangular array of interleaved red (R), green (G) and blue (B) color filters. Each color filter preferably extends opposite a respective microlens. The first and second polarizing layers may comprise silicon dioxide or a polymer material, for example.

The preferred lens layer is formed on an upper face of the imaging substrate. The array of microlenses in the lens layer may be formed by reflowing a two-dimensional array of spaced photoresist regions (e.g., resist cylinders) as circular-shaped lenses having convex outer surfaces. A light dispersion layer is also preferably formed on the face of the imaging substrate. The light dispersion layer may be formed as a conformally deposited mesh-shaped layer having openings therein which are defined by the array of microlenses and having concave-shaped depressions therein which extend between adjacent microlenses. The light dispersion layer may be formed as a Spin-On Glass (SOG) layer of a siloxane series. The light dispersion layer is preferably formed of a material having an index of refraction in a range between about 1.45 and 1.50 and the microlenses are preferably formed of a material (e.g., photoresist) having an index of refraction in a range between about 1.65 and 1.70. Here, the light collection efficiency of the imaging substrate is improved by forming the light dispersion layer using a material which has a lower index of refraction relative to the material used to form the microlenses. To further improved light collection efficiency, the thickness of the light dispersion layer is also set at a level which is insufficient to fully cover the microlenses. In particular, the thickness and material constituting the light dispersion layer is preferably chosen so that light which passes through the light dispersion layer is directed towards and collected by the light receiving elements in the substrate, instead of being reflected laterally or backwards towards the source of light.

DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. It will also be understood that when a layer is referred to as being "on" another layer or substrate, it can be directly on the other layer or substrate, or intervening layers may also be present.

Figure 1:
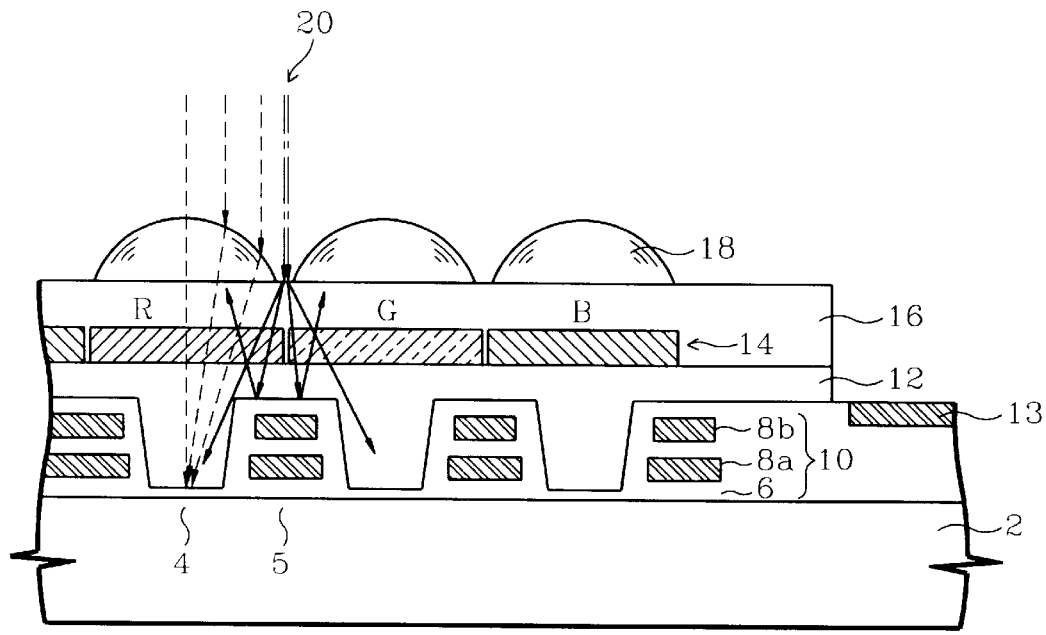
FIG. 1 is a cross-sectional view of a solid-state imaging device according to the prior art.
Figure 2:
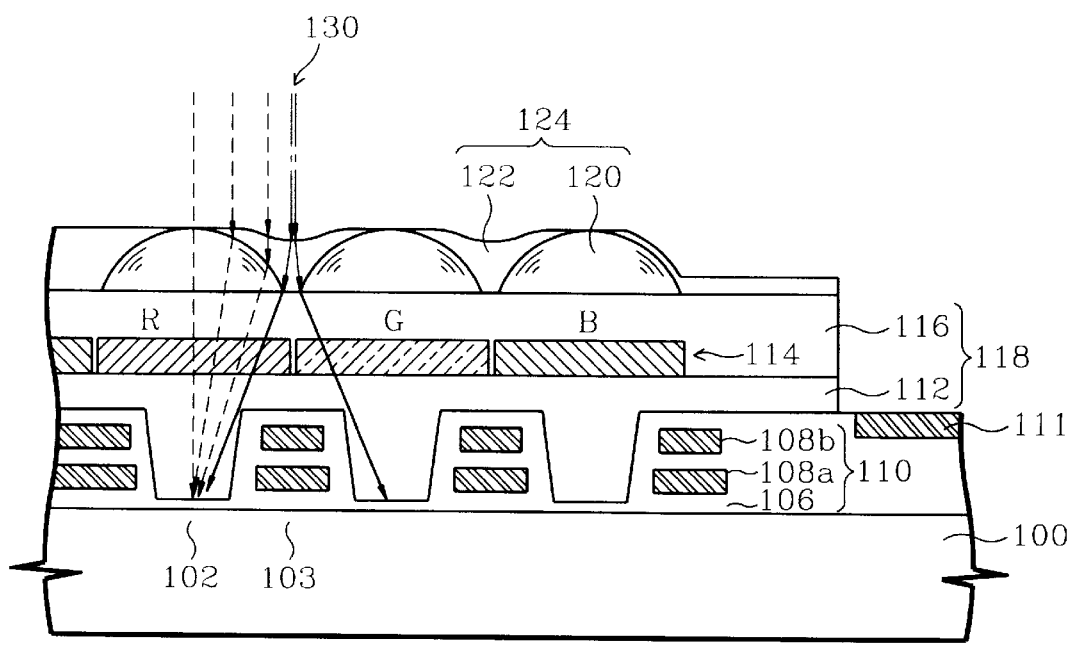
FIG. 2 is a cross-sectional view of a solid-state imaging device according to a preferred embodiment of the present invention.

Referring now to FIG. 2, a solid-state imaging device according to a preferred embodiment of the present invention includes a semiconductor substrate 100, a light transmission layer 118 and a lens layer 124. The semiconductor substrate 100 and light transmission layer 118 collectively form an imaging substrate having a face thereon and a plurality of light sensing elements therein extending adjacent the face. The lens layer 124 comprises an array of microlenses 120 and a light dispersion layer 122, as described more fully hereinbelow. The light sensing elements may be formed as an array of photosensitive charge-coupled devices (CCD) having a plurality of gate electrodes 110, channel regions 103 (which extend opposite respective gate electrodes 110) and light receiving elements 102 (e.g., photodiodes) which generate charge carriers in the semiconductor substrate 100 in response to incident light 130 which passes through the light transmission layer 118. The gate electrodes 110 may comprise first and second polysilicon layers 108a, 108b which are electrically insulated by a gate electrode insulating region 106. The construction and operation of such photosenstive CCDs are well known to those skilled in the art and need not be further described herein. A light shielding film (not shown) may also be formed on the gate electrodes 110 to block light. The light transmission layer 118 may include a first polarizing layer 112, an array 114 of color filters and a second polarizing layer 116, arranged as illustrated. The light transmission layer 118 may be patterned to expose a pad layer 111. The thickness of the light transmission layer 118 may also be chosen to improve the efficiency of charge carrier generation in the light receiving elements 102 by appropriately matching the focal length of the microlenses 120 to the distance between the microlenses 120 and the light receiving elements 102. The array 114 of color filters may comprise a rectangular array of interleaved red (R), green (G) and blue (B) color filters and this array 114 may extend in a third dimension (not shown). As described more fully hereinbelow, each color filter preferably extends opposite a respective microlens 120. The first and second polarizing layers 112 and 116 may comprise silicon dioxide or a polymer material, for example.

Referring still to FIG. 2, the preferred lens layer 124 is formed on an upper face of the imaging substrate. As described more fully hereinbelow with respect to FIGS. 3A–3D, the array of microlenses 120 in the lens layer 124 may be formed by reflowing a two-dimensional array of spaced photoresist regions (e.g., resist cylinders) as circular-shaped lenses having convex outer surfaces. A light dispersion layer 122 is also preferably formed on the face of the imaging substrate. Preferably, the light dispersion layer 122 is formed as a conformally deposited mesh-shaped layer having openings therein which are defined by the array of microlenses 120 and having concave-shaped depressions therein which extend between adjacent microlenses 120. The light dispersion layer 122 may be formed as a Spin-On Glass (SOG) layer of a siloxane series. The light dispersion layer 122 is preferably formed of a maternal having an index of refraction in a range between about 1.45 and 1.50 and the microlenses 120 are preferably formed of a material (e.g., photoresist) having an index of refraction in a range between about 1.65 and 1.70. Here, the light collection efficiency of the imaging substrate is improved by forming the light dispersion layer 122 using a material which has a lower index of refraction relative to the material used to form the microlenses 120. To further improved light collection efficiency, the thickness of the light dispersion layer 122 is also set at a level which is insufficient to fully cover the microlenses 120. For example, the thickness of the light dispersion layer 122 may be set at a level in a range between about 1.5 and 2.5 $\mu$m. Thus, the thickness and material constituting the light dispersion layer 122 is preferably chosen so that light 130 which passes through the light dispersion layer 122 is directed towards and collected by the light receiving elements 102 in the substrate 100, instead of being reflected laterally or backwards towards the source of light 130.

Referring now to FIGS. 3A–3D, preferred methods of forming the solid-state imaging device of FIG. 2 include the step of forming an array of photosensitive CCDs at a face of a semiconductor substrate 100 using conventional techniques. A conductive pad layer 111 may also be formed by depositing and patterning a conductive layer. A light shielding layer (not shown) may also be formed to cover the insulated gate electrodes 110 of the CCD array. The light transmission layer 118 may also be formed by depositing and then planarizing a layer of silicon dioxide as a first polarization layer 112. Conventional techniques may then be used to pattern an array 114 of color filters on the first polarization layer 112. Here, each color filter may be patterned to extend diametrically opposite a respective light receiving element 102 in the substrate 100. A second polarization layer 116 may also be formed by depositing a layer of silicon dioxide of preferred thickness on the array 114 of color filters and on portions of the first polarization layer 112 not covered by the array 114 of color filters.

Figure 3A:
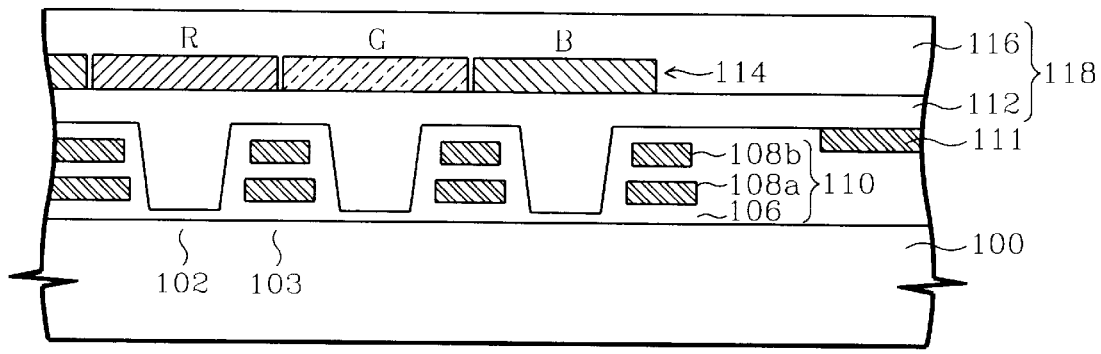
FIGS. 3A–3D are cross-sectional views of intermediate structures which illustrate a preferred method of forming the solid-state imaging device of FIG. 2.
Figure 3B:
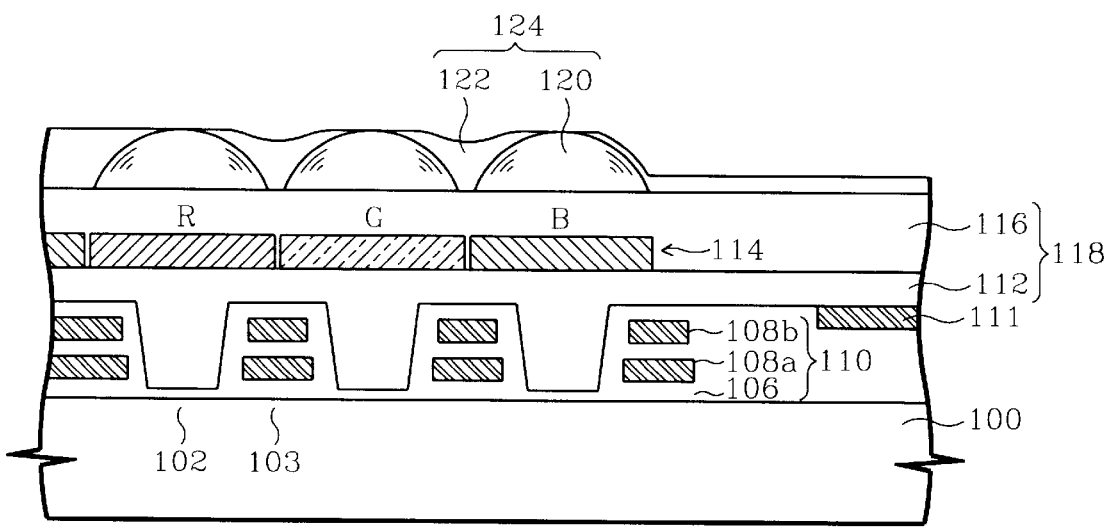
Figure 3C:
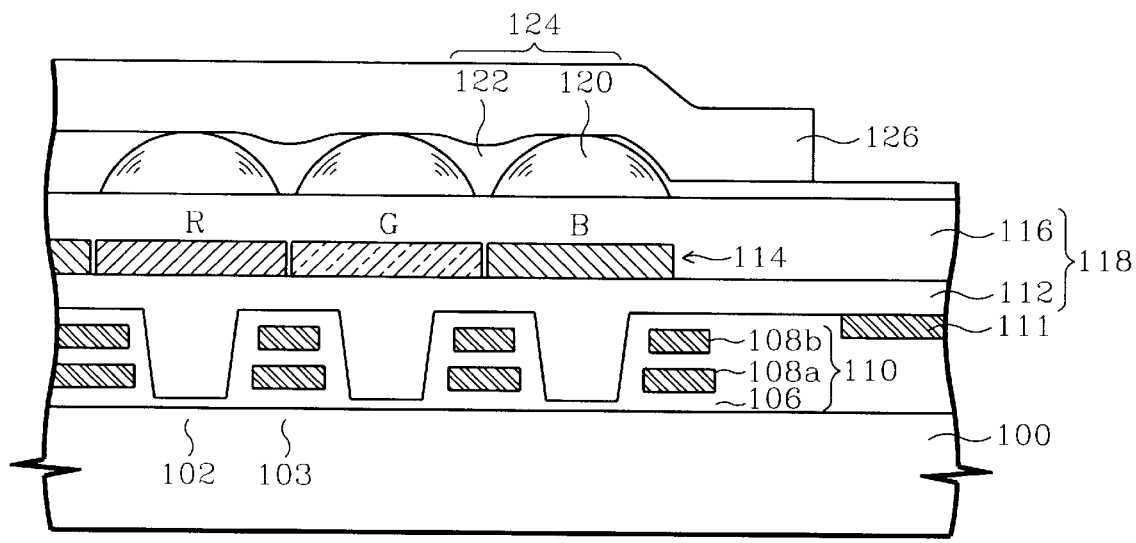
Figure 3D:
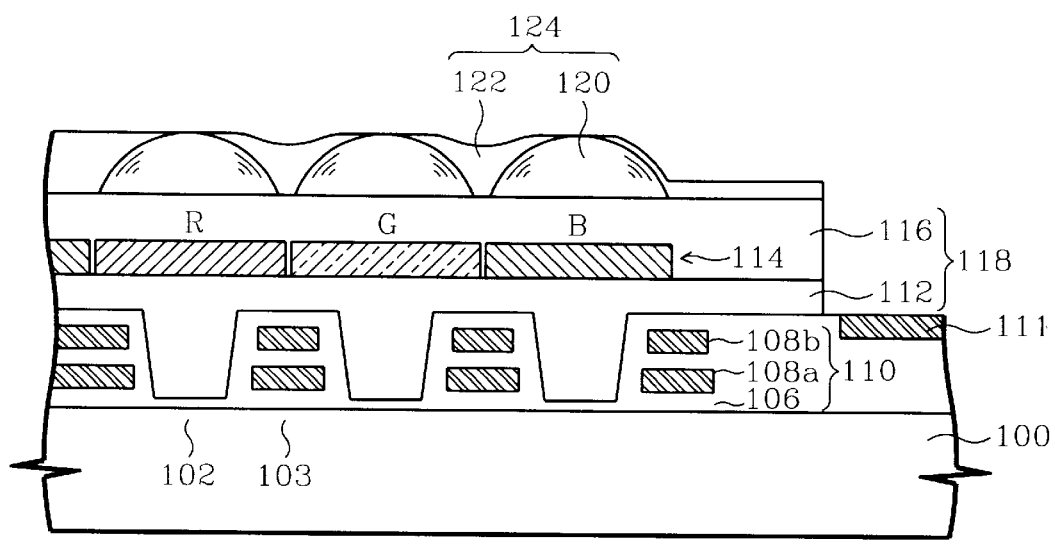

Referring now to FIG. 3B, a layer of photoresist (not shown) may then be deposited on the second polarization layer 116. The layer of photoresist may be patterned as an array of spaced cylindrical regions and then reflowed using conventional techniques to form a two-dimensional array of microlenses 120 having convex outer surfaces, as illustrated. Other materials may also be used besides photoresist. Such materials preferably have an index of refraction in a range between about 1.65 and 1.70. A light dispersion layer 122 is then formed on the array of microlenses 120 by conformally depositing a layer of material having a preferred index of refraction in a range between about 1.45 and 1.50. As illustrated, the conformally deposited layer 122 may include an array of concave-shaped depressions in its surface which line up with the spaces (e.g., submicron gaps) between adjacent microlenses 120. Here, the lower index of refraction (relative to the microlenses 120) and the concave-shaped depressions each contribute to a focusing of light 130 towards the light receiving elements 102. The light dispersion layer 122 may be formed by depositing a Spin-On Glass (SOG) layer of a siloxane series on the array of microlenses 120 and may have a thickness in a range between about 1.5 and 2.5 $\mu$m. Referring now to FIGS. 3C–3D, a blanket mask layer 126 may then be deposited and patterned on the light dispersion layer 122. A plasma etching step may then be performed to expose pad layer 111.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A solid-state imaging device, comprising:
   an imaging substrate containing a plurality of light sensing elements therein extending adjacent a face thereof;
   an array of microlenses having convex-shaped outer surfaces on the face; and
   a light dispersion layer on the face, extending between the microlenses in said array thereof and contacting the convex-shaped outer surfaces wherein a surface of said light dispersion layer has an array of concave-shaped depressions therein;

wherein said light dispersion layer is a mesh-shaped layer having openings therein; and wherein the microlenses extend through the openings in the light dispersion layer.

2. The imaging device of claim 1, wherein an index of refraction of said light dispersion layer is less than an index of refraction of the microlenses.

3. The imaging device of claim 2, wherein said light dispersion layer is comprised of a material having an index of refraction in a range between about 1.45 and 1.50; and wherein the microlenses comprise a material having an index of refraction in a range between about 1.65 and 1.70.

4. The imaging device of claim 2, wherein said imaging substrate comprises an array of color filter elements which extends between the light sensing elements and the face; and wherein each of the color filter elements extends diametrically opposite a respective microlens in said array thereof.

5. The imaging device of claim 4, further comprising:

a first polarizing layer extending between said array of color filter elements and the light sensing elements; and a second polarizing layer extending between said array of color filter elements and said array of microlenses.

6. A solid-state imaging device, comprising:

an imaging substrate containing a plurality of light sensing elements therein extending adjacent a face thereof;

a mesh-shaped light dispersion layer on the face of said imaging substrate, said mesh-shaped light dispersion layer having a plurality of openings therein and comprising a material having a first index of refraction; and a plurality of microlenses of a second material having a second index of refraction which is greater than the first index on the face of said imaging substrate, each of said plurality of microlenses extending through a respective opening in said mesh-shaped light dispersion layer.

7. The imaging device of claim 6, wherein the microlenses have respective convex-shaped outer surfaces; and wherein said light dispersion layer contacts the convex-shaped outer surfaces.

8. The imaging device of claim 7, wherein a surface of said light dispersion layer has an array of concave-shaped depressions therein.

9. The imaging device of claim 8, wherein each of said plurality of microlenses extends opposite a respective light sensing element in said imaging substrate.

10. The imaging device of claim 6, wherein the first index of refraction is in a range between about 1.45 and 1.50 and the second index of refraction is in a range between about 1.65 and 1.70.

11. A method of forming a solid-state imaging device, comprising the steps of:

forming an imaging substrate containing a plurality of light sensing elements therein extending adjacent a face thereof;

forming an array of microlenses on the face; and forming a light dispersion layer which extends between the microlenses in said array thereof, on the face;

wherein said step of forming a light dispersion layer comprises forming a light dispersion layer as a mesh-shaped layer having openings therein; and wherein each of the microlenses in the array thereof extends through a respective opening in the light dispersion layer.

12. The method of claim 11, wherein said step of forming a light dispersion layer comprises forming a light dispersion layer having a plurality of concave-shaped depressions therein.

* * * * *

UNITED STATES PATENT AND TRADEMARK OFFICE
CERTIFICATE OF CORRECTION

PATENT NO.      : 6,157,017
DATED           : December 5, 2000
INVENTOR(S)     : Sang-Sik Kim It is certified that error appears in the above-identified patent and that said Letters Patent is hereby corrected as shown below:

Column 4,
Line 66, change "surfaces" to -- surfaces; --.

Column 5,
Line 15, change "2" to -- 1 --.

Signed and Sealed this

Eighth Day of April, 2003

JAMES E. ROGAN
*Director of the United States Patent and Trademark Office*